US011721882B2

(12) United States Patent
Han et al.

(10) Patent No.: US 11,721,882 B2
(45) Date of Patent: Aug. 8, 2023

(54) SEMICONDUCTOR PACKAGE HAVING DISCRETE ANTENNA DEVICE

(71) Applicant: MediaTek Inc., Hsin-Chu (TW)

(72) Inventors: Fu-Yi Han, Taichung (TW); Che-Ya Chou, Kaohsiung (TW); Che-Hung Kuo, Tainan (TW); Wen-Chou Wu, Hsinchu (TW); Nan-Cheng Chen, Hsin-Chu (TW); Min-Chen Lin, Hsin-Chu (TW); Hsing-Chih Liu, Taichung (TW)

(73) Assignee: MediaTek Inc., Hsin-Chu (TW)

( * ) Notice: Subject to any disclaimer, the term of this patent is extended or adjusted under 35 U.S.C. 154(b) by 297 days.

(21) Appl. No.: 17/075,561

(22) Filed: Oct. 20, 2020

(65) Prior Publication Data

US 2021/0036405 A1  Feb. 4, 2021

Related U.S. Application Data

(63) Continuation of application No. 15/974,700, filed on May 9, 2018, now Pat. No. 10,847,869.

(60) Provisional application No. 62/584,155, filed on Nov. 10, 2017, provisional application No. 62/579,947, filed on Nov. 1, 2017, provisional application No. 62/516,150, filed on Jun. 7, 2017.

(51) Int. Cl.
*H01Q 1/22* (2006.01)
*H01L 23/66* (2006.01)
(Continued)

(52) U.S. Cl.
CPC ..... *H01Q 1/2283* (2013.01); *H01L 23/49816* (2013.01); *H01L 23/49827* (2013.01); *H01L 23/5384* (2013.01); *H01L 23/5389* (2013.01); *H01L 23/66* (2013.01); *H01L 24/16* (2013.01); *H01L 24/20* (2013.01); *H01L 2223/6616* (2013.01); *H01L 2223/6677* (2013.01); *H01L 2224/04105* (2013.01); *H01L 2224/12105* (2013.01); *H01L 2224/13144* (2013.01);
(Continued)

(58) Field of Classification Search
CPC ........... H01Q 1/22; H01L 23/49; H01L 23/53; H01L 23/66
USPC .......................................................... 343/878
See application file for complete search history.

(56) References Cited

U.S. PATENT DOCUMENTS 8,890,284 B2  11/2014  Kilger et al.
9,496,219 B2  11/2016  Yoo et al.
(Continued)

FOREIGN PATENT DOCUMENTS

CN  102237342 A  11/2011
CN  103258817 A  8/2013
(Continued)

OTHER PUBLICATIONS

U.S. Appl. No. 15/974,700, filed May 9, 2018, Han et al.
U.S. Appl. No. 16/867,583, filed May 6, 2020, Wu et al.

*Primary Examiner* — Andrea Lindgren Baltzell
(74) *Attorney, Agent, or Firm* — Wolf, Greenfield & Sacks, P.C.

(57) ABSTRACT

One embodiment of the present disclosure provides a semiconductor package including a bottom chip package having a first side and a second side opposing the first side, and a top antenna package mounted on the first side of the bottom chip package. The bottom chip package further includes a semiconductor chip. The semiconductor chip may include a RFIC chip. The top antenna package has at least one radiative antenna element.

14 Claims, 9 Drawing Sheets

(51) Int. Cl.
*H01L 23/498* (2006.01)
*H01L 23/538* (2006.01)
*H01L 23/00* (2006.01)

(52) U.S. Cl.
CPC ............ *H01L 2224/13147* (2013.01); *H01L 2224/16141* (2013.01); *H01L 2224/16227* (2013.01); *H01L 2224/16235* (2013.01); *H01L 2224/48227* (2013.01); *H01L 2225/1023* (2013.01); *H01L 2225/1035* (2013.01); *H01L 2225/1058* (2013.01); *H01L 2924/1421* (2013.01); *H01L 2924/15192* (2013.01); *H01L 2924/15311* (2013.01); *H01L 2924/15321* (2013.01); *H01L 2924/19042* (2013.01); *H01L 2924/19106* (2013.01)

(56) References Cited

U.S. PATENT DOCUMENTS

| | | | |
|---|---|---|---|
| 10,847,869 B2 | 11/2020 | Han et al. | |
| 2008/0041619 A1* | 2/2008 | Lee | H01L 24/82 29/830 |
| 2012/0280860 A1 | 11/2012 | Kamgaing et al. | |
| 2013/0293420 A1* | 11/2013 | Yehezkely | H01Q 21/0093 342/372 |
| 2014/0239438 A1* | 8/2014 | Kilger | H01L 23/5384 257/528 |
| 2016/0049723 A1 | 2/2016 | Baks et al. | |
| 2017/0040266 A1 | 2/2017 | Lin et al. | |
| 2018/0358685 A1 | 12/2018 | Han et al. | |
| 2020/0303806 A1 | 9/2020 | Wu et al. | |

FOREIGN PATENT DOCUMENTS

| | | |
|---|---|---|
| CN | 104037166 A | 9/2014 |
| CN | 104701269 A | 6/2015 |
| CN | 105720049 A | 6/2016 |
| CN | 206179848 U | 5/2017 |
| CN | 109449141 A | 3/2019 |
| TW | 201216417 A1 | 4/2012 |
| TW | 201903994 A | 1/2019 |
| TW | 201911437 A | 3/2019 |
| WO | 2015/088486 A1 | 6/2015 |
| WO | 2017/171831 A1 | 10/2017 |

* cited by examiner

SEMICONDUCTOR PACKAGE HAVING DISCRETE ANTENNA DEVICE

CROSS REFERENCE TO RELATED APPLICATIONS

This application is a Continuation of U.S. application Ser. No. 15/974,700, filed May 9, 2018, entitled "SEMICONDUCTOR PACKAGE HAVING DISCRETE ANTENNA DEVICE", which claims priority from U.S. provisional application No. 62/516,150 filed Jun. 7, 2017, U.S. provisional application No. 62/579,947 filed Nov. 1, 2017, and U.S. provisional application No. 62/584,155 filed Nov. 10, 2017, the subject matter of each of which is hereby incorporated by reference.

BACKGROUND

This disclosure relates generally to the field of semiconductor packaging and, more particularly, to a semiconductor package including a discrete antenna device.

As known in the art, shorter interconnect between chips and antennas is more and more critical in millimeter-wave (mmW) applications. To achieve shorter interconnect between chips and antennas, as well as smaller volume and higher integration of semiconductor packages, Antenna in Package (AiP) that consists of integrated circuit (IC) chips and antenna(s) inside a package has been developed in the field of semiconductor chip packaging.

Unfortunately, demands on the substrate layers are quite different between the antennas and the routing design. Typically, it is required to employ thin build-up layers in the substrate layers so as to enable thin vias and dense interconnects. However, this requirement conflicts with the requirements for antenna design, which typically needs thick, almost evenly spaced substrate layers.

SUMMARY

The main object of the present invention is to provide an improved semiconductor package to overcome the deficiencies and disadvantages of the prior art.

One embodiment of the present disclosure provides a semiconductor package including a bottom chip package having a first side and a second side opposing the first side, and a top antenna package mounted on the first side of the bottom chip package. The bottom chip package further includes a semiconductor chip. The semiconductor chip may include a RFIC chip, a base-band IC chip or a System-in-Chip (SOC) die. The top antenna package has at least one radiative antenna element.

According to one embodiment, the bottom chip package may include a package substrate having a core with at least one plated through-hole, and at least one build-up layer. The build-up layer may include at least one via and conductive traces therein to route signals, ground, and/or power throughout the bottom chip package. The conductive traces on a bottom surface of the build-up layer may be in the form of pads onto which the semiconductor chip is attached with conductive elements. The core may include epoxy laminates of fiberglass sheets, prepreg, FR-4 materials, FR-5 materials, or combinations thereof.

According to one embodiment, the top antenna package may include a substrate. The substrate may include a ceramic substrate, a semiconductor substrate, a dielectric substrate, or a glass substrate. The substrate may include at least one plated through-hole to route signals from one side of the substrate to the other side of the substrate. The radiative antenna element is disposed on a surface of the substrate. The top antenna package may be a low temperature co-fired ceramic (LTCC), a flip-chip chip-scale-package (FCCSP) or a fan-out type chip package.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of the invention, reference is made to the accompanying drawings which forma part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms "die", "chip", "semiconductor chip", and "semiconductor die" are used interchangeable throughout the specification to mean integrated circuit chip or die. The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane.

Figure 1:
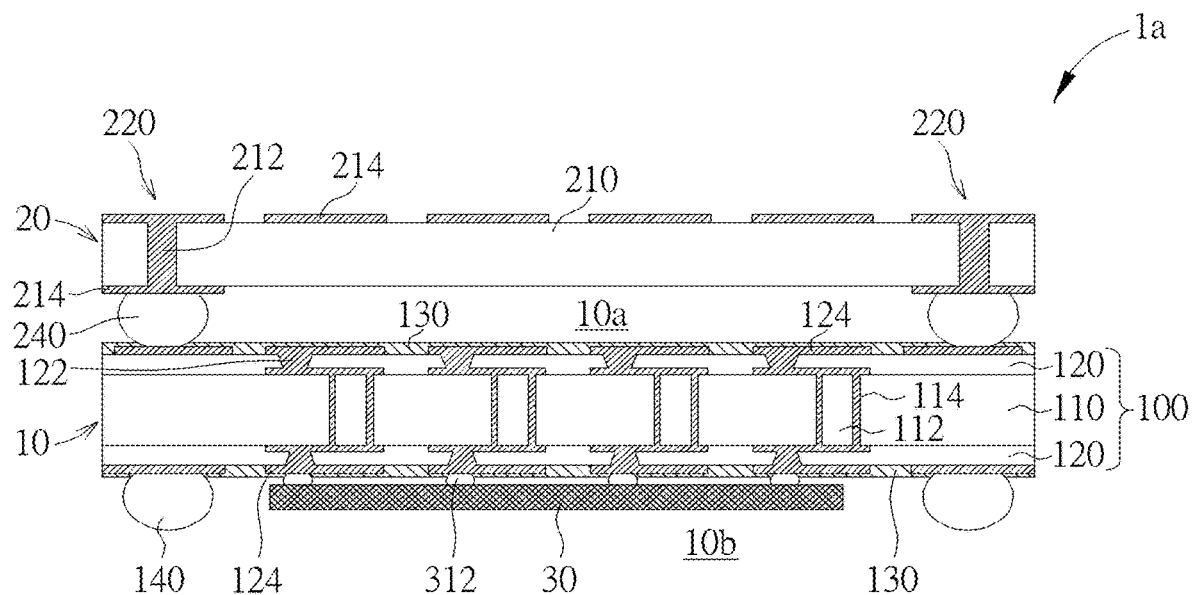
FIG. 1 is a schematic, cross-sectional diagram showing an exemplary semiconductor package 1a including a discrete antenna device mounted on a bottom chip package according to one embodiment of the invention.

The present disclosure pertains to a semiconductor package including at least one discrete antenna device (or top antenna package) mounted on a bottom semiconductor chip package (or bottom chip package), thereby forming an antenna package-on-package structure. The exemplary semiconductor packages disclosed in various embodiments herein provide the advantages including, but not limited to, lower package cost, shorter lead-time, and/or better design flexibility over the conventional antenna in packages. According to some embodiments of the disclosure FIG. 1 is a schematic, cross-sectional diagram showing an exemplary semiconductor package 1a including a discrete antenna device mounted on a bottom chip package according to one embodiment of the invention. According to one embodiment, the semiconductor package may be a wireless module and the discrete antenna device may be an antenna package. As shown in FIG. 1, the semiconductor package 1a comprises a bottom chip package 10 and a top antenna package 20 mounted on the bottom chip package 10. The bottom chip package 10 has a first side 10a and a second side 10b that is opposite to the first side 10a. The top antenna package 20 may be mounted on the first side 10a. The bottom chip package 10 may comprise a semiconductor chip (or semiconductor die) 30 mounted on the second side 10b. For example, the semiconductor chip 30 may be a RFIC chip, a base-band IC chip, a System-in-Chip (SOC) die, but is not limited thereto.

According to one embodiment, the bottom chip package 10 may comprise a package substrate 100 having a core 110 with one or more plated through-holes 112, and one or more build-up layers 120. The build-up layers 120 may have one or more vias 122 and/or conductive traces 114 formed therein to route signals, ground, and/or power throughout the bottom chip package 10. Conductive traces 124 on a bottom surface of the bottom build-up layer 120 may be in the form of one or more pads onto which the semiconductor chip 30 may be attached with conductive elements 312. For example, the conductive elements 312 may comprise solder balls, solder bumps, copper bumps, gold bumps, or any suitable conductive means known in the art.

For example, the core 110 may include any suitable material comprising epoxy laminates of fiberglass sheets, prepreg, FR-4 materials, FR-5 materials, or combinations thereof. The conductive traces 114, 124, the plated through-holes 112, and the vias 122 may include any suitable conductive materials comprising copper, silver, gold, nickel, or combinations thereof. The build-up layers 120 may include any suitable dielectric materials comprising polyimide, prepreg, polymers, or the like.

According to one embodiment, the bottom chip package 10 may further comprise solder mask layers 130 on the first side 10a and the second side 10b. For interconnection purposes, the solder mask layers 130 may comprise openings for exposing the corresponding pads in the conductive traces 124. According to one embodiment, an array of conductive elements 140 may be disposed on the second side 10b of the bottom chip package 10 for further interconnection to a printed circuit board or a main board.

The top antenna package 20 is electrically coupled to the bottom chip package 10 through conductive elements 240, which are coupled to the traces 124 on the top surface of the top build-up layer 120 in the form of one or more pads and to the traces 214 on the bottom surface of the substrate 210 in the form of one or more pads. For example, the conductive elements 240 may comprise solder balls, solder bumps, copper bumps, gold bumps, or any suitable conductive means known in the art. The top antenna package 20 may comprise a substrate 210. The substrate 210 may comprise one or more plated through-holes 212 to route signals from one side of the substrate 210 to the other side of the substrate 210.

For example, the substrate 210 may be a ceramic substrate, a semiconductor substrate, a dielectric substrate, a glass substrate, but is not limited thereto. According to embodiments of the invention, the top antenna package 20 may be a low temperature co-fired ceramic (LTCC), a flip-chip chip-scale-package (FCCSP), a fan-out type chip package, a laminate-based package or a wire-bond type package and not limited.

According to one embodiment, the top antenna package 20 does not include a semiconductor chip or die. The top antenna package 20 may further comprise a radiative antenna element 220 in the conductive trace 214 disposed on a surface of the substrate 210. The radiative antenna element 220 may comprise an antenna array or a mechanism for radiating and/or receiving electro-magnetic signals such as RF wireless signals or millimeter-wave (mmW) signals. Although not shown in this figure, it is understood that the radiative antenna element 220 may be disposed at a bottom surface of the substrate 210 depending upon the design requirements. For example, the radiative antenna element 220 may be may be of any suitable type, such as patch antennas, slot-coupled antenna, stacked patches, dipoles, monopoles, etc., and may have different orientations and/or polarizations. In some embodiments, the radiative antenna element 220 could rout signals from one side of the substrate 210 to the other side of the substrate 210 through one or more plated through-holes 212 or other conductive traces disposed within the substrate 210.

Besides, the radiative antenna element 220 could comprise multiple antenna modules, for example, a dual-band antenna element and a single-band antenna element, and not limited.

FIGS. 2-9 show some exemplary variants of the semiconductor package as depicted in FIG. 1 according to various embodiments of the invention, wherein like numeral numbers designate like layers, regions, or elements. It is to be understood that the features of the various exemplary embodiments described herein may be combined with each other, unless specifically noted otherwise.

Figure 2:
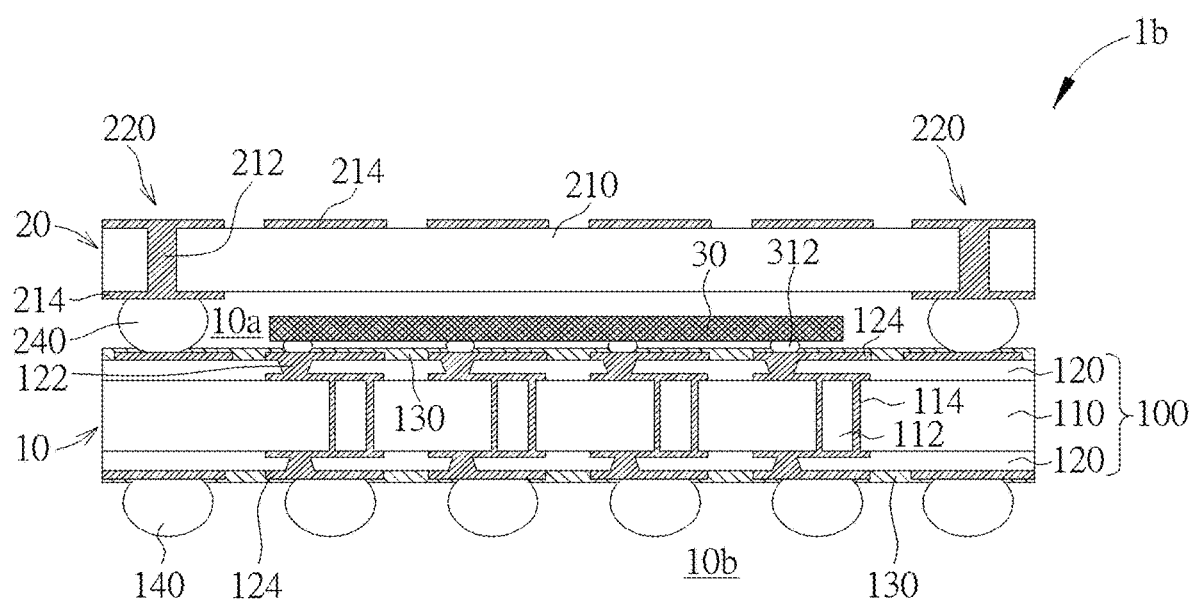
FIGS. 2-9 show some exemplary variants of the semiconductor package as depicted in FIG. 1 according to various embodiments of the invention.

As shown in FIG. 2, the difference between the semiconductor package 1b and the semiconductor package 1a is that the semiconductor chip 30 of the semiconductor package 1b is disposed on the same side as the top antenna package 20. For example, the semiconductor chip 30 and the top antenna package 20 are both mounted on the first side 10a of the bottom chip package 10. Likewise, the semiconductor chip 30 may be attached with the corresponding pads in the conductive trace 124 through the conductive elements 312. Although not shown in the figures, it is to be understood that an underfill layer may be disposed between the semiconductor chip 30 and the first side 10a of the bottom chip package 10. In a non-liming example, the semiconductor chip 30 may be mounted directly under the top antenna package 20.

Figure 3:
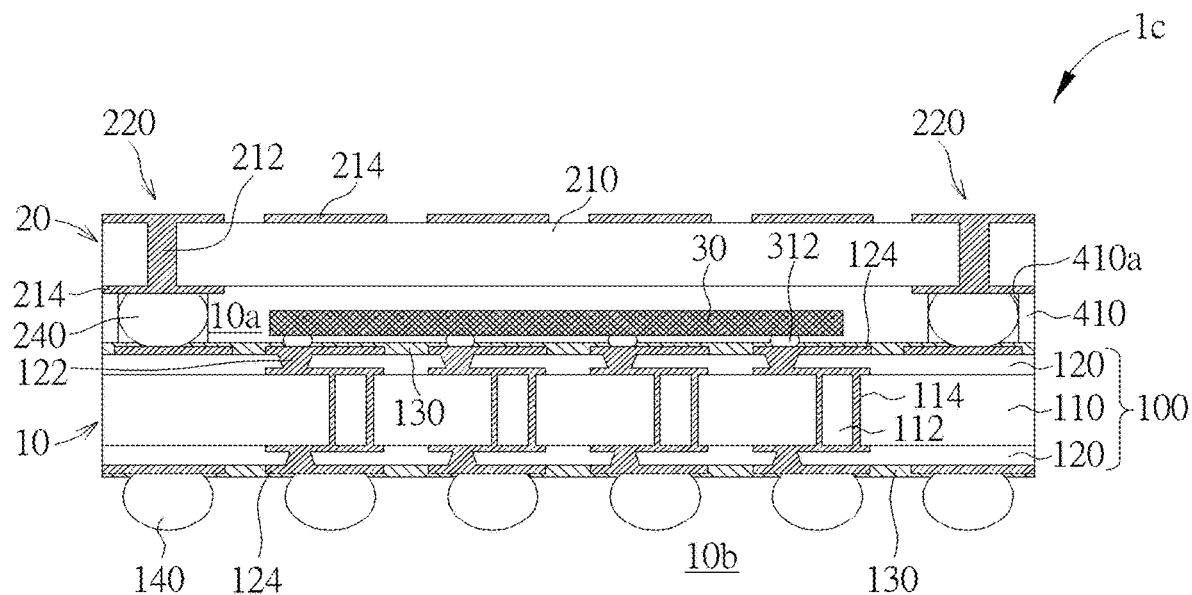

As shown in FIG. 3, and briefly to FIG. 2, the difference between the semiconductor package 1c and the semiconductor package 1b is that the semiconductor package 1c further comprises a molding compound 410 between the top antenna package 20 and the bottom chip package 10. According to one embodiment, the molding compound 410 may comprise epoxy or polymers, but is not limited thereto. The molding compound 410 may cover and encapsulate the semiconductor chip 30. According to one embodiment, the molding compound 410 may fill into the gap between the semiconductor chip 30 and the first side 10a of the bottom chip package 10. According to one embodiment, the molding compound 410 may comprise through mold vias 410a. The conductive elements 240 may be disposed within the through mold vias 410a, respectively.

Figure 4:
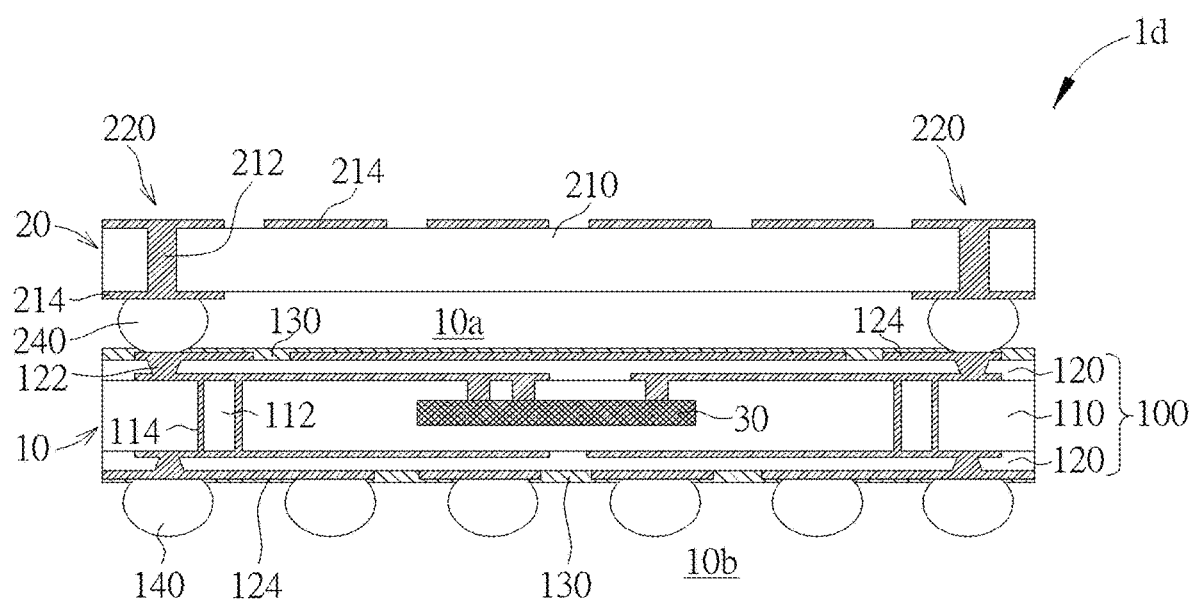

As shown in FIG. 4, and briefly to FIG. 2, the difference between the semiconductor package 1d and the semiconductor package 1b is that the semiconductor chip 30 of the semiconductor package 1d is embedded in the core 110 of the package substrate 100. It is understood that the semiconductor chip 30 may be directly embedded in the build-up layers 120. For example, the semiconductor chip 30 may be mounted on the core 110 of the package substrate 100 and embedded inside a film of dielectric layer. In another embodiment, a cavity (not shown) may be formed in the package substrate 100 and the semiconductor chip 30 is placed inside this cavity. The semiconductor chip 30 may be bonded by conventional bonding techniques.

Figure 5:
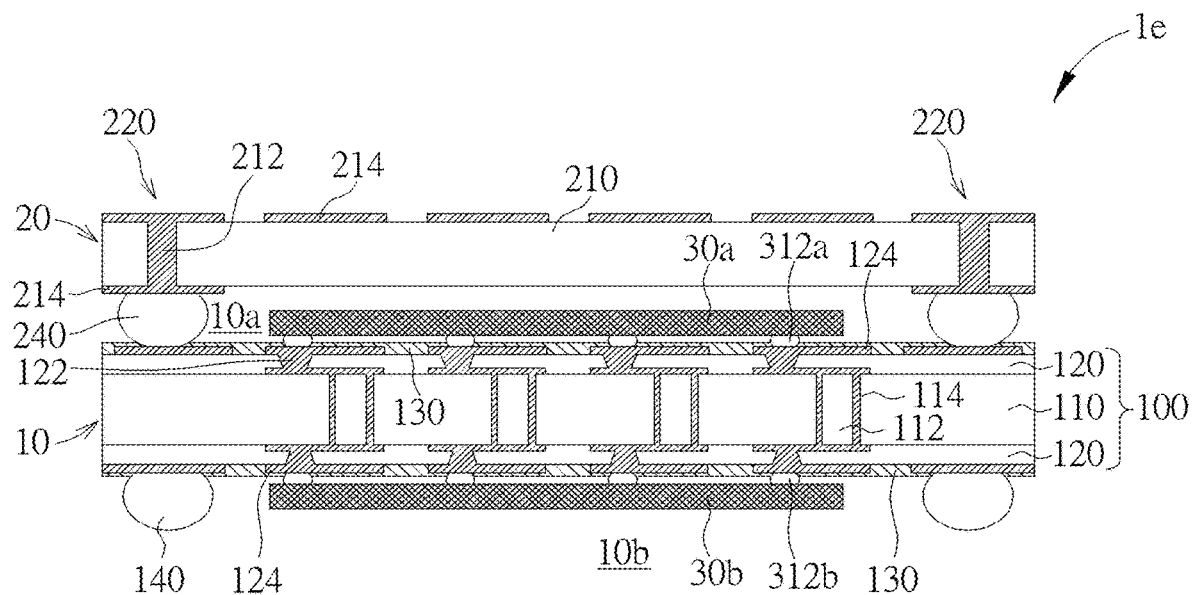

As shown in FIG. 5, the semiconductor package 1e comprises multiple semiconductor dies, for example, a semiconductor chip 30a and a semiconductor chip 30b, which may be disposed on the first side 10a and the second side 10b of the bottom chip package 10, respectively. The semiconductor chip 30a may be electrically connected to the package substrate 100 through the conductive elements 312a. The semiconductor chip 30b may be electrically connected to the package substrate 100 through the conductive elements 312b.

Figure 6:
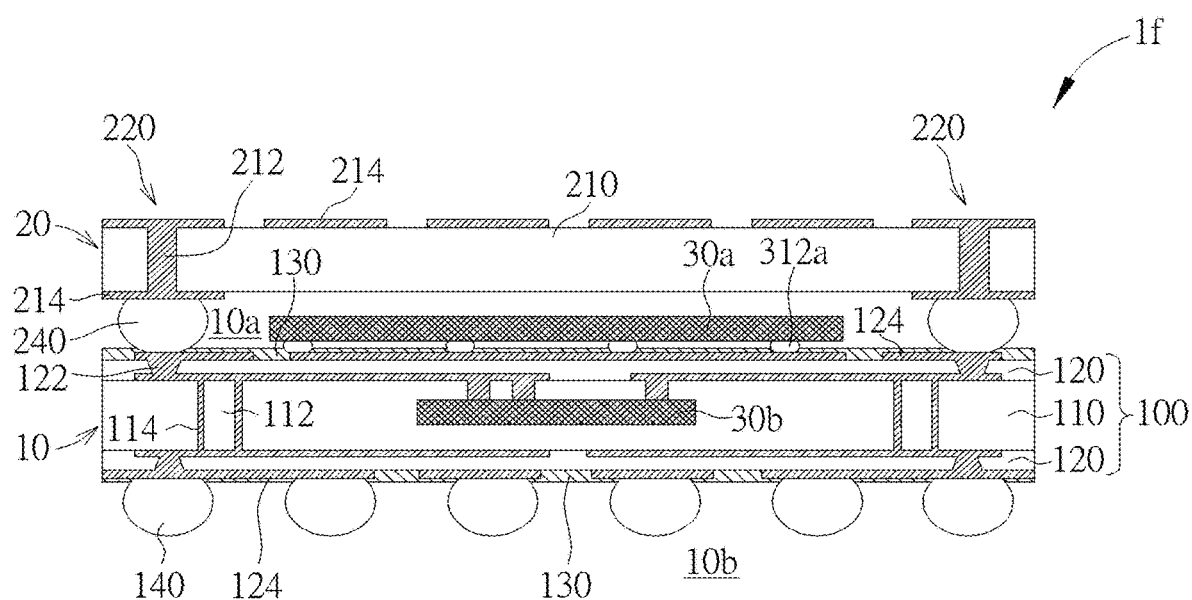

As shown in FIG. 6, the semiconductor package 1f comprises multiple semiconductor dies, for example, a semiconductor chip 30a and a semiconductor chip 30b. The semiconductor chip 30a may be disposed on the first side 10a of the bottom chip package 10. The semiconductor chip 30b may be embedded in the package substrate 100.

Figure 7:
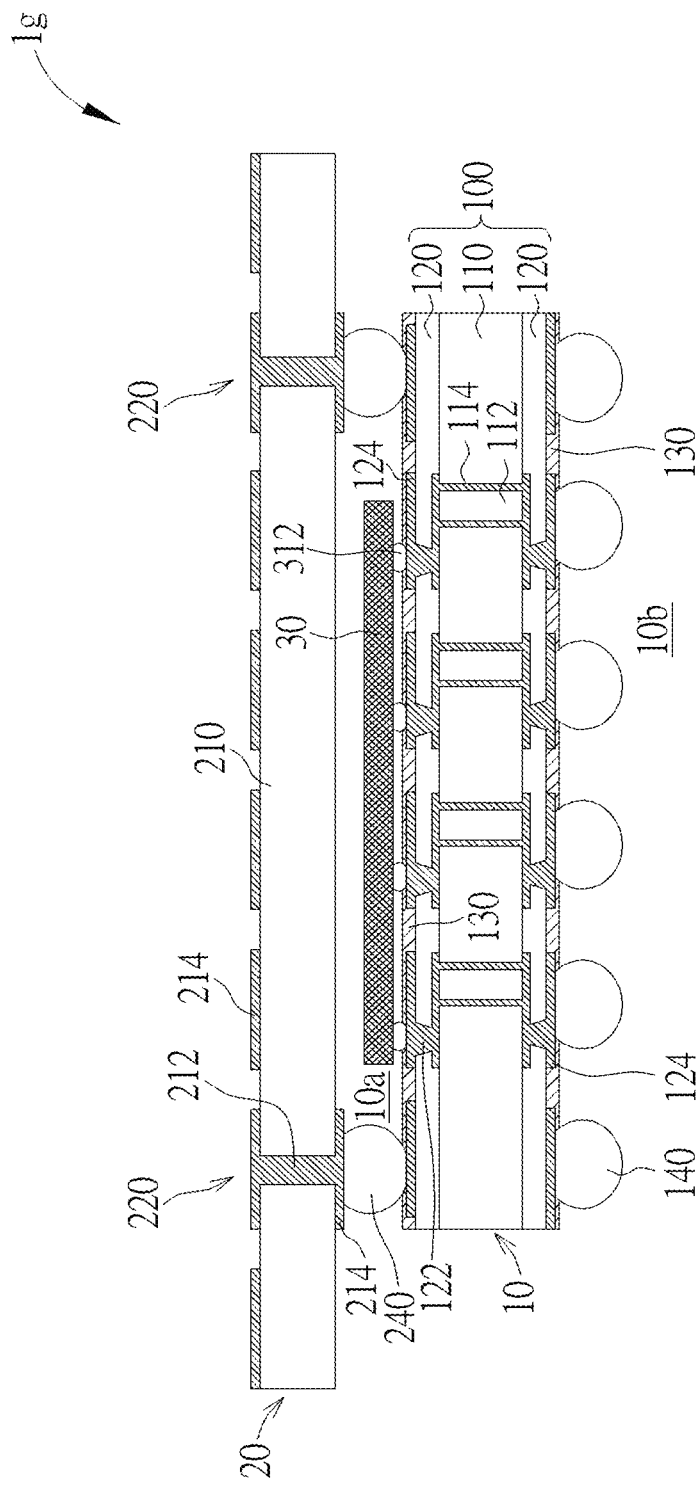

As shown in FIG. 7, likewise, the semiconductor package 1g comprises a bottom chip package 10 and the top antenna package 20 mounted on the first side 10a of the bottom chip package 10. According to the illustrated embodiment, the top antenna package 20 may be larger in size than the bottom chip package 10.

Figure 8:
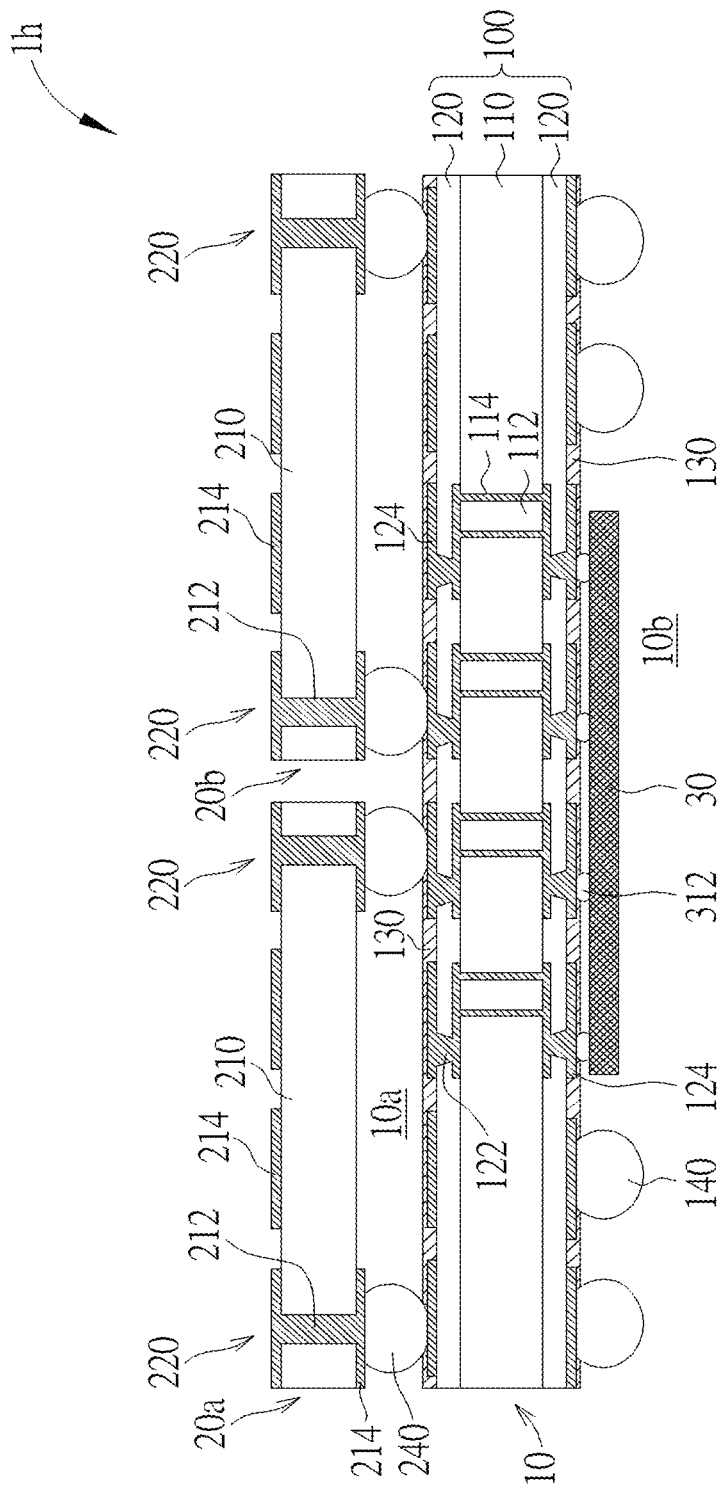

As shown in FIG. 8, the semiconductor package 1h comprises a bottom chip package 10 and multiple top antenna packages, for example, top antenna package 20a and top antenna package 20b, mounted on the first side 10a of the bottom chip package 10. The semiconductor chip 30 may be mounted on the second side 10b of the bottom chip package 10. According to the illustrated embodiment, the top antenna packages 20a and 20b may be smaller in size than the bottom chip package 10. According to another embodiment, the top antenna packages 20a and 20b may be larger in size than the bottom chip package 10.

Figure 9:
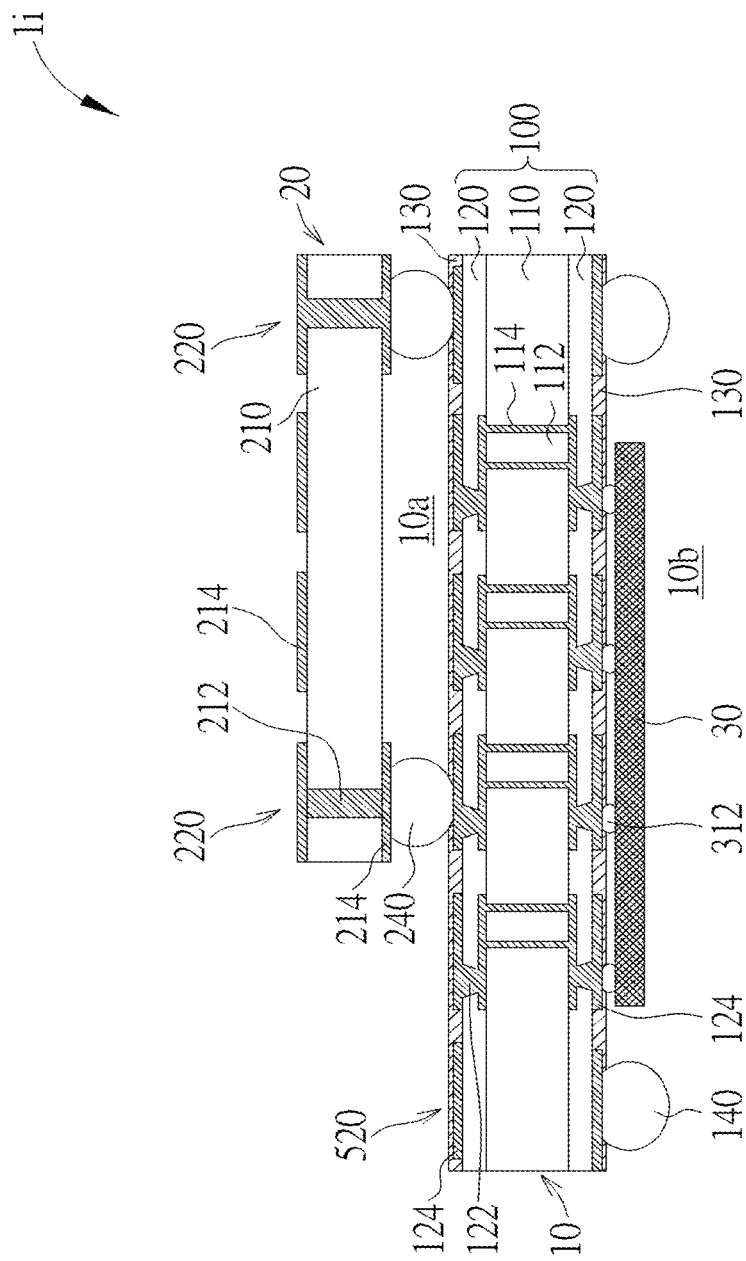

As shown in FIG. 9, the semiconductor package 1i comprises a bottom chip package 10 and a top antenna package 20 mounted on the first side 10a of the bottom chip package 10. The top antenna package 20 may comprise a radiative antenna element 220 in the conductive trace 214 disposed on a surface of the substrate 210. The radiative antenna element 220 may comprise an antenna array or a mechanism for radiating and/or receiving electro-magnetic signals such as RF wireless signals or millimeter-wave mmW signals.

The semiconductor package 1i may further comprise a radiative antenna element 520 in the conductive trace 124 disposed on the first side 10a of the bottom chip package 10. The radiative antenna element 520 does not overlap with the radiative antenna element 220. In a non-limiting example, the radiative antenna element 220 may be a dual-band antenna element, and the radiative antenna element 520 may be a single-band antenna element.

It is advantageous to use the present disclosure because by forming the top antenna package 20 separately from the bottom chip package 10, lower package cost, shorter lead-time, and better design flexibility may be achieved. The top antenna package 20 and the bottom chip package 10 may be manufactured with materials, structure, and/or processes that may be relatively optimal for the semiconductor package. For example, the bottom chip package 10 may be manufactured with multi-layer interconnect (e.g., multiple build-up layers on either side of the core 110) to accommodate dense routing. The top antenna package 20, on the other hand, in this example, may only have a single layer (e.g., a strip of dielectric with pad interfaces on one side and radiating elements on the other side). In non-limiting examples, a low-k dielectric may be used in the bottom chip package 10 to route signals with reduced parasitics (e.g., reduced resistive-capacitive (RC) delays), while relatively higher-k materials may be employed in the top antenna package 20 to enable reduced form factor antennas.

FIGS. 10-13 are schematic, cross-sectional diagram showing some exemplary packages, for example, top antenna packages, according to other embodiments of the invention, wherein like numeral numbers designate like layers, regions, or elements. It is to be understood that the features of the various exemplary embodiments described herein may be combined with each other, unless specifically noted otherwise. For the sake of simplicity, only germane portions of the exemplary top antenna packages are shown in the figures.

It is to be understood that the structures or features as depicted in FIGS. 10-13 are not limited to the top antenna packages. It is to be understood that the structures or features as depicted in FIGS. 10-13 may be employed in the bottom chip packages 10 as set forth in previous figures. It is also appreciated that some features depicted in one figure of FIGS. 10-13 may be combined with other features in another figure of FIGS. 10-13 without departing the spirit and scope of the invention.

Figure 10:
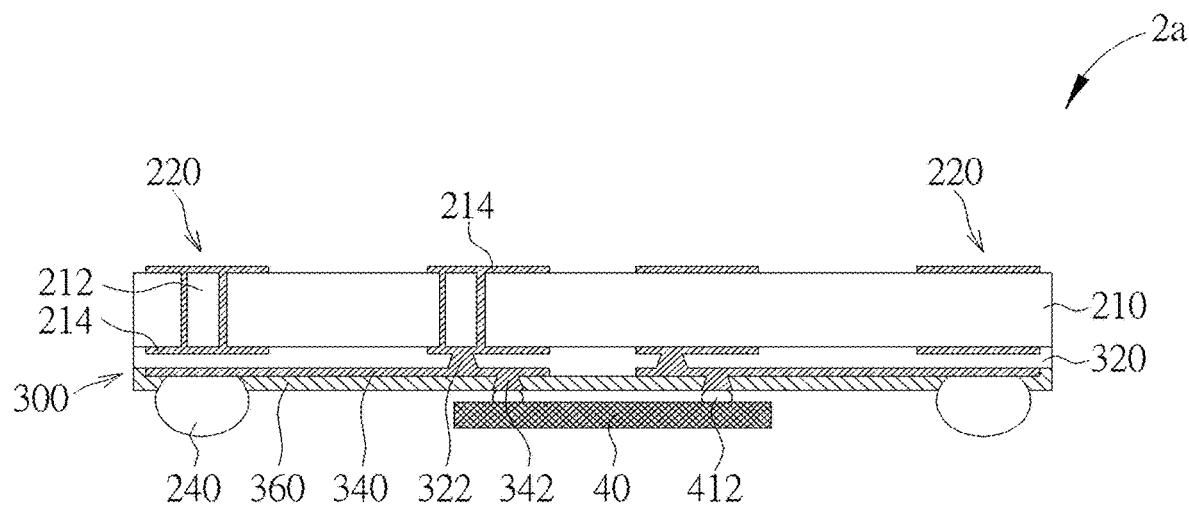
FIGS. 10-13 are schematic, cross-sectional diagram showing exemplary top antenna packages according to other embodiments of the invention.

As shown in FIG. 10, the top antenna package 2a comprises a substrate 210. For example, the substrate 210 may be a ceramic substrate, a semiconductor substrate, a dielectric substrate, a glass substrate, but is not limited thereto. Conductive traces 214 are formed on opposite surfaces of the substrate 210. The substrate 210 may comprise one or more plated through-holes 212 to route signals from one side of the substrate 210 to the other side of the substrate 210. According to embodiments of the invention, for example, the top antenna package 2a may be a package with a chip or an electronic element. On one surface of the substrate 210, for example, a bottom surface of the substrate 210, a re-wiring layer 300 may be disposed on the bottom surface of the substrate 210.

In a non-limiting example, the re-wiring layer 300 may comprise a dielectric layer 320 laminated on the bottom surface of the substrate 210, a conductor layer 340 on the dielectric layer 320, and a protective layer 360 on the conductor layer 340. The dielectric layer 320 may comprise any suitable insulating layers such as silicon oxide, silicon nitride, polyimide or the like. The conductor layer 340 may comprise copper, but is not limited thereto. The protective layer 360 may comprise any suitable passivation layers or solder masks. The conductor layer 340 may be electrically connected to the conductive trace 214 through the vias 322 in the dielectric layer 320. In a non-limiting example, a semiconductor chip 40 may be mounted on the re-wiring layer 300. The semiconductor chip 40 may be electrically connected to the conductor layer 340 through the contact elements 342 and the conductive elements 412. In some other example, the semiconductor chip 40 could be omitted.

A radiative antenna element 220 may be disposed in the conductive trace 214 on a surface of the substrate 210, for example, the top surface of the substrate 210. The radiative antenna element 220 may comprise an antenna array or a mechanism for radiating and/or receiving electro-magnetic signals such as RF wireless signals or mmW signals. Although not shown in this figure, it is understood that the radiative antenna element 220 may be disposed at a bottom surface of the substrate 210 depending upon the design requirements. For example, the radiative antenna element 220 may be may be of any suitable type, such as patch antennas, stacked patches, dipoles, monopoles, etc., and may have different orientations and/or polarizations.

Figure 11:
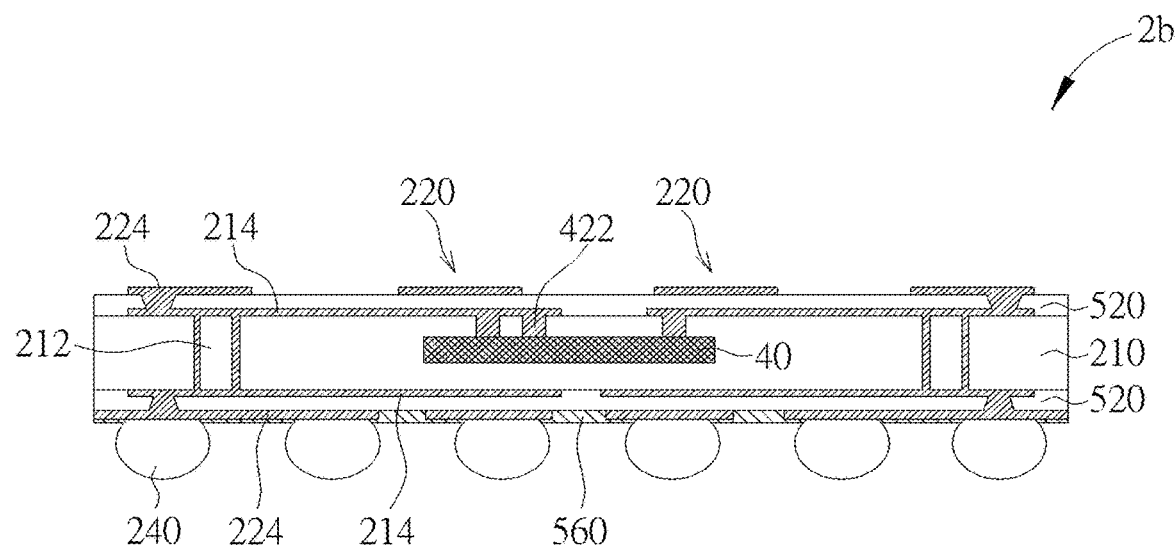

As shown in FIG. 11, likewise, the top antenna package 2b comprises a core or a substrate 210. For example, the substrate 210 may be a ceramic substrate, a semiconductor substrate, a dielectric substrate, a glass substrate, but is not limited thereto. Dielectric layers 520 and conductive traces 214, 224 are formed on opposite surfaces of the substrate 210. A protective layer 560 may be disposed to cover the conductive trace 224 and the dielectric layers 520. The dielectric layer 520 may comprise any suitable insulating layers such as silicon oxide, silicon nitride, polyimide or the like. The protective layer 560 may comprise any suitable passivation layers or solder masks. The substrate 210 may comprise one or more plated through-holes 212 to route signals from one side of the substrate 210 to the other side of the substrate 210.

According to embodiments of the invention, for example, the top antenna package 2b may be an embedded-chip package, which is a package embedded with a semiconductor chip 40. In a non-limiting example, the semiconductor chip 40 may embedded in the substrate 210. The semiconductor chip 40 may be electrically connected to the conductive trace 214 through the contact elements 422. In some other example, the semiconductor chip 40 could be omitted.

A radiative antenna element 220 may be disposed in the conductive trace 224 disposed on the substrate 210, for example, on the top surface of the substrate 210. The radiative antenna element 220 may comprise an antenna array or a mechanism for radiating and/or receiving electro-magnetic signals such as RF wireless signals or mmW signals. Although not shown in this figure, it is understood that the radiative antenna element 220 may be disposed at a bottom surface of the substrate 210 depending upon the design requirements. For example, the radiative antenna element 220 may be may be of any suitable type, such as patch antennas, stacked patches, dipoles, monopoles, etc., and may have different orientations and/or polarizations.

Figure 12:
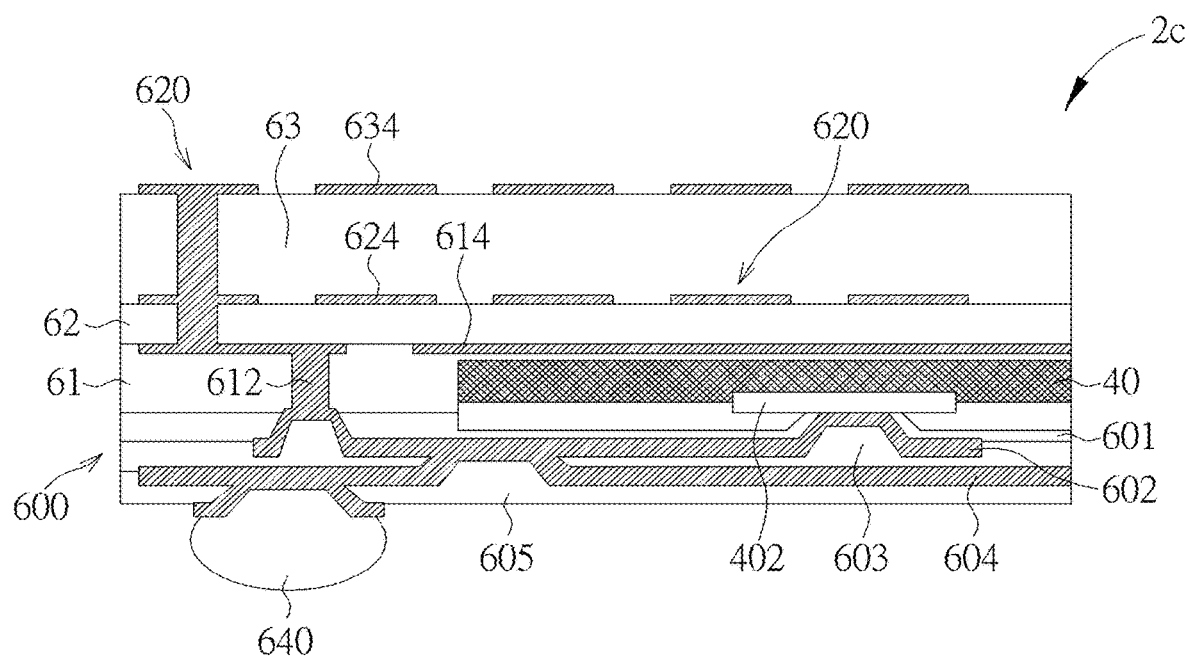

As shown in FIG. 12, the top antenna package 2c may be a fan-out type chip package, wherein at least some of the package pads and/or conducting lines connecting the chip to the package pads are located laterally outside of the outline of the chip or do at least intersect the outline of the chip. Furthermore, the top antenna package 2c could be a wafer level chip scale package (WLCSP). In a non-limiting example, the top antenna package 2c may comprise a chip 40 encapsulated by a first molding compound 61. The first molding compound 61 may cover the inactive bottom surface and four sidewall surfaces of the chip 40 and may expose an active surface of the chip 40. On the active surface of the chip 40, a plurality of bonding pads or input/output (I/O) pads 402 are arranged. In some other example, the semiconductor chip 40 could be omitted.

A re-distribution layer (RDL) structure 600 may be disposed on the active surface of the chip 40 and on a surface of the first molding compound 61 and may be electrically connected to the I/O pads 402 of the chip 40. In a non-limiting example, the RDL structure 600 may comprise dielectric layers 601, 603, and 605, and conductor layers 602, 604 in the dielectric layers 601, 603, and 605. At least one conductive element 640 such as a solder bump, a solder ball, or a metal bump/pillar may be formed on the dielectric layer 605 for further connection. The dielectric layers 601, 603, and 605 may comprise any suitable insulating layers such as silicon oxide, silicon nitride, polyimide or the like. The conductor layers 602, 604 may comprise copper, but is not limited thereto.

In a non-limiting example, the top antenna package 2c may comprise a conductive trace 614 on the first molding compound 61, a second molding compound 62 on the first molding compound 61 and on the conductive trace 614, a conductive trace 624 on the second molding compound 62, a third molding compound 63 on the second molding compound 62 and on the conductive trace 624, and a conductive trace 634 on the third molding compound 63. Through mold vias 612 may be disposed in the first molding compound 61 for the signal transmission between the RDL structure 600 and the conductive traces 614, 624 and 634.

Radiative antenna elements 620 may be disposed in the conductive traces 624, 634. The radiative antenna element 620 may comprise an antenna array or a mechanism for radiating and/or receiving electro-magnetic signals such as RF wireless signals or mmW signals. Although not shown in this figure, it is understood that the radiative antenna elements 620 may be disposed in any layers of the conductive traces 614, 624 and 634 depending upon the design requirements. For example, the radiative antenna element 620 may be may be of any suitable type, such as patch antennas, stacked patches, dipoles, monopoles, etc., and may have different orientations and/or polarizations.

Figure 13:
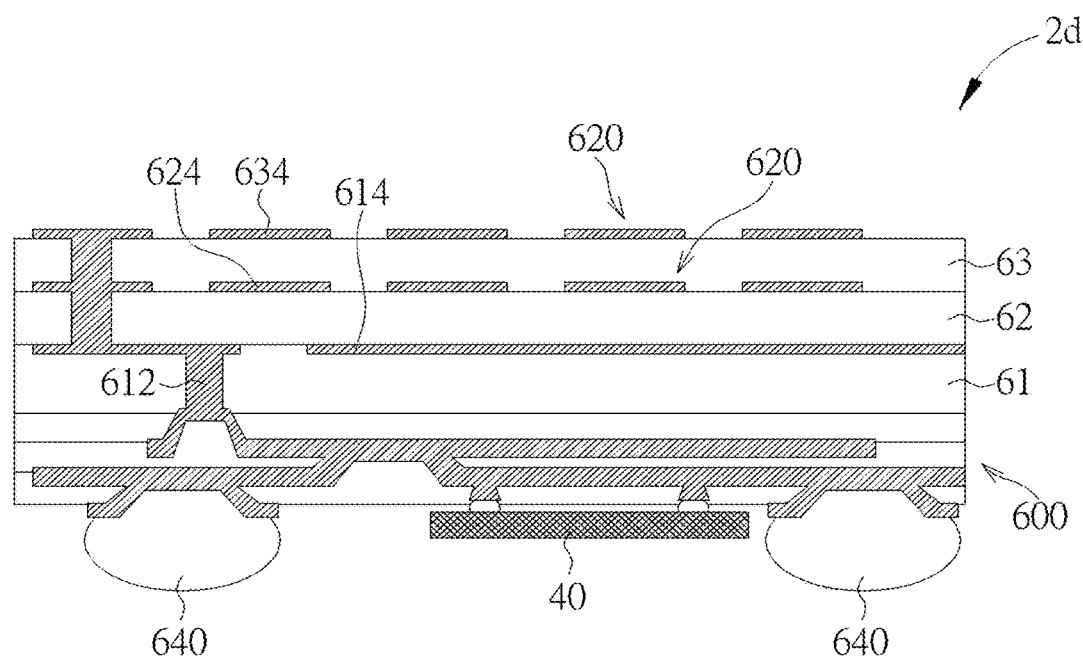

As shown in FIG. 13, the top antenna package 2d may have a similar stack structure as that depicted in FIG. 12. The difference between the top antenna package 2d and the top antenna package 2c depicted in FIG. 12 is that the semiconductor chip 40 of the top antenna package 2d is externally mounted on the RDL structure 600. Likewise, radiative antenna elements 620 may be disposed in the conductive traces 624, 634. The radiative antenna element 620 may comprise an antenna array or a mechanism for radiating and/or receiving electro-magnetic signals such as RF wireless signals or mmW signals. Although not shown in this figure, it is understood that the radiative antenna elements 620 may be disposed in any layers of the conductive traces 614, 624 and 634 depending upon the design requirements. For example, the radiative antenna element 620 may be may be of any suitable type, such as patch antennas, stacked patches, dipoles, monopoles, etc., and may have different orientations and/or polarizations. In some other example, the semiconductor chip 40 could be omitted.

Figure 14:
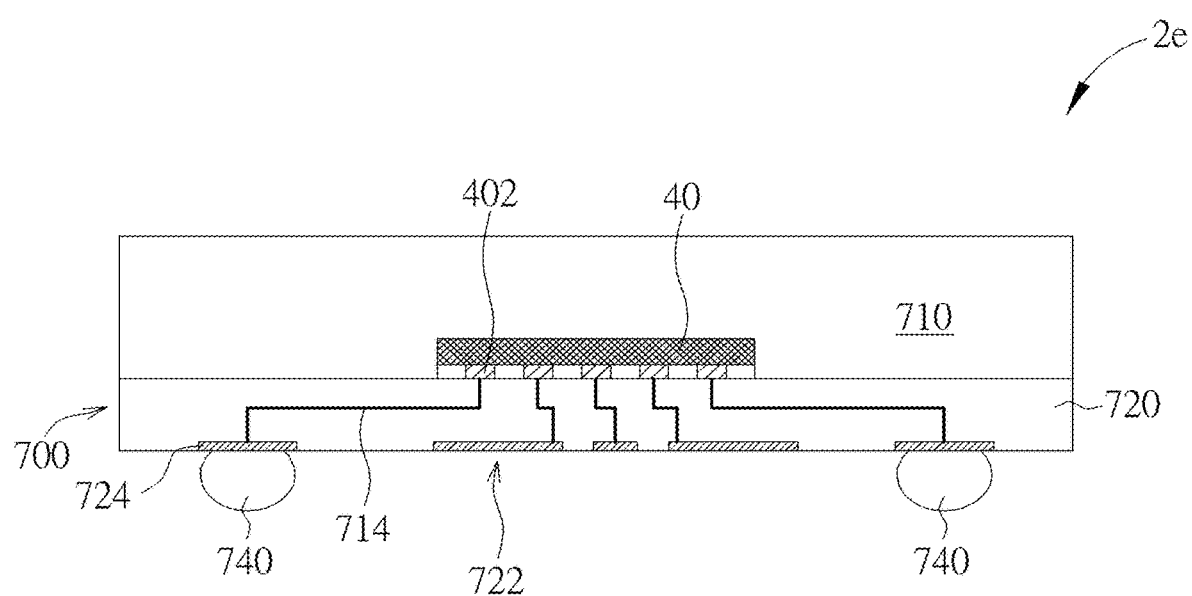
FIG. 14 illustrates an exemplary fan-out type chip package for the top antenna package.

For example, FIG. 14 illustrates an exemplary fan-out type chip package 2e for the top antenna package. As shown in FIG. 14, the fan-out type chip package 2e is a package embedded with a semiconductor chip 40, wherein at least some of the package pads 724 and/or conducting lines 714 connecting the semiconductor chip 40 to the package pads 724 are located laterally outside of the outline of the semiconductor chip 40 or do at least intersect the outline of the semiconductor chip 40. The fan-out type chip package 2e may comprise a molding compound 710 encapsulating the sidewalls and a non-active upper surface of the chip 40. The active surface of the semiconductor chip 40 is not covered with the molding compound 710. The input/output (I/O) pads 402 on the active surface of the semiconductor chip 40 are electrically connected to the re-distribution layer (RDL) structure 700 constructed on the active surface of the semiconductor chip 40 and on the lower surface of the molding compound 710. The RDL structure 700 comprises at least one dielectric layer 720, the conducting lines 714 in the at least one dielectric layer 720 for connecting the I/O pads 402 of the semiconductor chip 40 to the package pads 724, and at least a radiative antenna element 722 in or on the at least one dielectric layer 720. The conductive elements 240 such as bumps or solder balls may be disposed on the package pads 724 for further connections. In some other example, the semiconductor chip 40 could be omitted.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
a bottom chip package having a first side and a second side opposing the first side, the bottom chip package comprising a package substrate having a core with at least one plated through-hole, and at least one build-up layer;
a semiconductor chip on the first side or the second side of the bottom chip package;
a discrete antenna device mounted on the first side of the bottom chip package and having a first radiative antenna element; and
conductive elements between the discrete antenna device and the bottom chip package to electrically interconnect the bottom chip package and the discrete antenna device.

2. The semiconductor package according to claim 1, wherein the semiconductor chip comprises a RFIC chip.

3. The semiconductor package according to claim 1, wherein the at least one build-up layer comprises at least one via and conductive traces therein to route signals, ground, and/or power throughout the bottom chip package.

4. The semiconductor package according to claim 3, wherein conductive traces on a bottom surface of the at least one build-up layer comprise pads onto which the semiconductor chip is attached with conductive elements.

5. The semiconductor package according to claim 1, wherein the core comprises epoxy laminates of fiberglass sheets, prepreg, FR-4 materials, FR-5 materials, or combinations thereof.

6. The semiconductor package according to claim 1, wherein the discrete antenna device comprises a plurality of antenna modules.

7. A semiconductor device, comprising:
a top antenna package comprising a substrate and a radiative antenna element, wherein a re-wiring layer is disposed on a first surface of the substrate, the re-wiring layer comprising a conductor layer and a solder mask;
a semiconductor die mounted on the re-wiring layer, wherein the solder mask is between the conductor layer and the semiconductor die; and
contact elements between the substrate and the semiconductor die to electrically interconnect to the semiconductor die and the radiative antenna element.

8. The semiconductor device according to claim 7, wherein the substrate comprises a ceramic substrate, a semiconductor substrate, a dielectric substrate, or a glass substrate.

9. The semiconductor device according to claim 7, wherein the substrate comprises at least one plated through-hole to route signals from one side of the substrate to the other side of the substrate.

10. The semiconductor device according to claim 7, wherein the radiative antenna element is disposed on a second surface of the substrate.

11. The semiconductor device according to claim 7, wherein the top antenna package is a low temperature co-fired ceramic (LTCC), a flip-chip chip-scale-package (FCCSP), a laminate-based package, wire-bond type package or a fan-out type chip package.

12. A semiconductor package, comprising:
a bottom chip package having a first side and a second side opposing the first side, the bottom chip package comprising a package substrate having a core with at least one plated through-hole, and at least one build-up layer
a semiconductor chip on the first side or the second side of the bottom chip package;
a first top antenna package mounted on the first side of the bottom chip package and having a first radiative antenna element;
conductive elements between the first top antenna package and the bottom chip package to electrically interconnect the bottom chip package and the first top antenna package; and
a second top antenna package mounted on the first side of the bottom chip package.

13. The semiconductor package according to claim 12, wherein the second top antenna package has a second radiative antenna element.

14. The semiconductor package according to claim 13, wherein the first radiative antenna element is a dual-band antenna element and the second radiative antenna element is a single-band antenna element.

* * * * *